(12) United States Patent
Cideciyan et al.

(10) Patent No.: US 8,139,304 B2
(45) Date of Patent: Mar. 20, 2012

(54) TAPE LAYOUT DESIGN FOR RELIABLE ECC DECODING

(75) Inventors: Roy Daron Cideciyan, Rueschlikon (CH); Thomas Mittelholzer, Zurich (CH); Kenji Ohtani, Fujisawa (JP); Paul J Seger, Tucson, AZ (US); Keisuke Tanaka, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/849,720

(22) Filed: Aug. 3, 2010

(65) Prior Publication Data

US 2012/0033321 A1    Feb. 9, 2012

(51) Int. Cl.
*G11B 5/09* (2006.01)
(52) U.S. Cl. .......................................... 360/48
(58) Field of Classification Search .............. 360/48, 360/55, 134, 77.12, 78.02, 40; 711/157; 714/763
See application file for complete search history.

(56) References Cited

U.S. PATENT DOCUMENTS

| | | | | |
|---|---|---|---|---|
| 5,555,516 A * | 9/1996 | Zook | ............... | 708/492 |
| 5,592,404 A * | 1/1997 | Zook | ............... | 708/492 |
| 6,282,039 B1 | 8/2001 | Bartlett | | |
| 7,786,905 B2 * | 8/2010 | Mittelholzer | ................ | 341/58 |
| 7,814,395 B2 * | 10/2010 | Monen et al. | ................ | 714/763 |
| 2004/0162939 A1 * | 8/2004 | Bartlett | ................ | 711/111 |
| 2010/0177420 A1 | 7/2010 | Cideciyan et al. | | |
| 2010/0177422 A1 | 7/2010 | Cideciyan et al. | | |
| 2010/0177436 A1 | 7/2010 | Bui et al. | | |
| 2010/0180180 A1 | 7/2010 | Cideciyan et al. | | |
| 2010/0226037 A1 | 9/2010 | Bui et al. | | |
| 2010/0226039 A1 | 9/2010 | Bui et al. | | |
| 2010/0232047 A1 * | 9/2010 | Cherubini et al. | ................ | 360/48 |

OTHER PUBLICATIONS

Standard ECMA-319, Standardizing Information and Communication Systems, Data Interchange on 12,7 mm 384-Track Magnetic Tape Cartridges—Ultrium-1 Format, Jun. 2001, http:/ /www.ecma.ch.

* cited by examiner

*Primary Examiner* — Fred Tzeng
(74) *Attorney, Agent, or Firm* — Nelson and Nelson; Daniel P. Nelson; Alexis V. Nelson

(57) ABSTRACT

A method for physically laying out data on tape is disclosed herein. In one embodiment, such a method includes receiving a data set, wherein the data set includes S sub data sets (SDSs) of fixed size and each SDS includes N codeword interleaves (CWIs). The method further distributes the CWIs for the S SDSs across T tracks on a physical tape medium such that the distances between CWIs of the same SDS are substantially maximized on the physical tape medium. To maximize the distances, the method periodically rotates the tracks within the data set by a track rotation value R, wherein the number of tracks T is equal to $2^k$, and the track rotation value R is equal to $2^{k-1}-1$. A corresponding apparatus is also disclosed herein.

20 Claims, 10 Drawing Sheets

| Format | T Tracks | S SDS | N Rows | Q CWIs | CWI Sets | Track Swaps | CWI Swaps | Track Rotation |
|---|---|---|---|---|---|---|---|---|
| A | 8 | 16 | 64 | 1024 | 128 | 0 | 0 | 1 |
| B | 16 | 64 | 64 | 4096 | 256 | 7 | 3 | 6 |
| C | 16 | 32 | 96 | 3072 | 192 | 11 | 5 | 6 |

Fig. 12
(Prior Art)

| Format | T Tracks | S SDS | N Rows | Q CWIs | CWI Sets | Track Swaps | CWI Swaps | Track Rotation |
|---|---|---|---|---|---|---|---|---|
| D | 32 | 64 | 96 | 6144 | 192 | 0 | 1 | 15 |

Fig. 13

TAPE LAYOUT DESIGN FOR RELIABLE ECC DECODING

BACKGROUND

1. Field of the Invention

This invention relates to magnetic tape recording, and more particularly to apparatus and methods for laying out data on magnetic tape.

2. Background of the Invention

In some tape drives, such as current LTO and enterprise-level tape drives, variable-length blocks of data are received from a host interface and converted into fixed-size units known as data sets. These data sets are typically broken into smaller fixed-size units known as sub data sets (SDSs). Error correction coding is then generated for each SDS as a unit to protect the data contained therein.

To protect the data in an SDS, conventional tape drives may organize the data in an SDS into a two-dimensional array of rows and columns. Each row in the two-dimensional array may be made up of multiple (e.g., 2 or 4) interleaved data words. Error correction codes (i.e., ECC codes) may then be generated for each row in the array and each column in the array to protect the data contained therein. This in essence provides two dimensions of protection for data in the array since protection is provided for both rows and columns. Once generated, the error correction codes may be appended to the array for eventual storage on the magnetic tape medium. Each row of the extended SDS array (which includes the appended ECC codes) may be referred to as a codeword interleave (CWI), the likes of which will be described in more detail hereafter.

In order to ensure the number of errors in an SDS do not overpower the ECC codes used to protect the SDS, the rows of the SDS may be physically distributed (i.e., laid out) on the magnetic tape in such a manner that, if errors occur spatially close to one another on the magnetic tape medium, the errors will be spread across multiple SDSs in the data set. This will ideally "decorrelate" error locations on the magnetic tape from error locations within an SDS. Stated otherwise, the rows of each SDS may be physically distributed on the magnetic tape medium with the intent of limiting the number of errors that occur in any one SDS. Limiting the number of errors occurring in an SDS increases the probability that the ECC parity associated with the SDS will be powerful enough to correct the errors contained therein.

The tape layout schemes used in five generations of LTO drives (i.e., LTO 1, 2, 3, 4, and 5) employ various combinations of track rotation, codeword interleave (CWI) set swaps, and track swaps in order to evenly distribute CWIs on the tape and thereby "decorrelate" error locations on the tape from error locations within each SDS. One drawback associated with these tape layout schemes is that they do not optimize the distances between CWIs to achieve an optimum degree of decorrelation. Thus, a tape layout design is needed that substantially maximizes the distances between the CWIs of each SDS, while evening out CWI set and track distribution, in order to increase decoding reliability.

SUMMARY

The invention has been developed in response to the present state of the art and, in particular, in response to the problems and needs in the art that have not yet been fully solved by currently available apparatus and methods. Accordingly, the invention has been developed to provide an improved tape layout design for reliable ECC decoding. The features and advantages of the invention will become more fully apparent from the following description and appended claims, or may be learned by practice of the invention as set forth hereinafter.

Consistent with the foregoing, a method for physically laying out data on tape is disclosed herein. In one embodiment, such a method includes receiving a data set, wherein the data set includes S sub data sets (SDSs) of fixed size and each SDS includes N codeword interleaves (CWIs). The method further distributes the CWIs for the S SDSs across T tracks on a physical tape medium such that the distances between CWIs of the same SDS are substantially maximized on the physical tape medium. To maximize the distances, the method periodically rotates the tracks within the data set by a track rotation value R, wherein the number of tracks T is equal to $2^k$, and the track rotation value R is equal to $2^{k-1}-1$. A corresponding apparatus is also disclosed and claimed herein.

In another aspect of the invention, a method for physically laying out data on tape includes receiving a data set, wherein the data set includes S SDSs of fixed size and each SDS includes N codeword interleaves (CWIs). The method further distributes the CWIs for the S SDSs across T tracks on a physical tape medium such that the distances between CWIs of the same SDS are substantially maximized on the medium. The method further organizes the CWIs into CWI sets, the CWI sets containing CWIs written simultaneously and transversely across the T tracks. The CWI sets include even CWI sets and odd CWI sets. To equalize any possible systematic differences between even CWI sets and odd CWI sets, the method swaps the position of the even CWI sets and the odd CWI sets a single time within the data set. A corresponding apparatus is also disclosed and claimed herein.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which:

FIG. 12 shows the characteristics of various prior art tape recording formats; and FIG. 13 shows the characteristics of an exemplary tape recording format incorporating an improved tape layout design in accordance with the invention.

DETAILED DESCRIPTION

Figure 1:
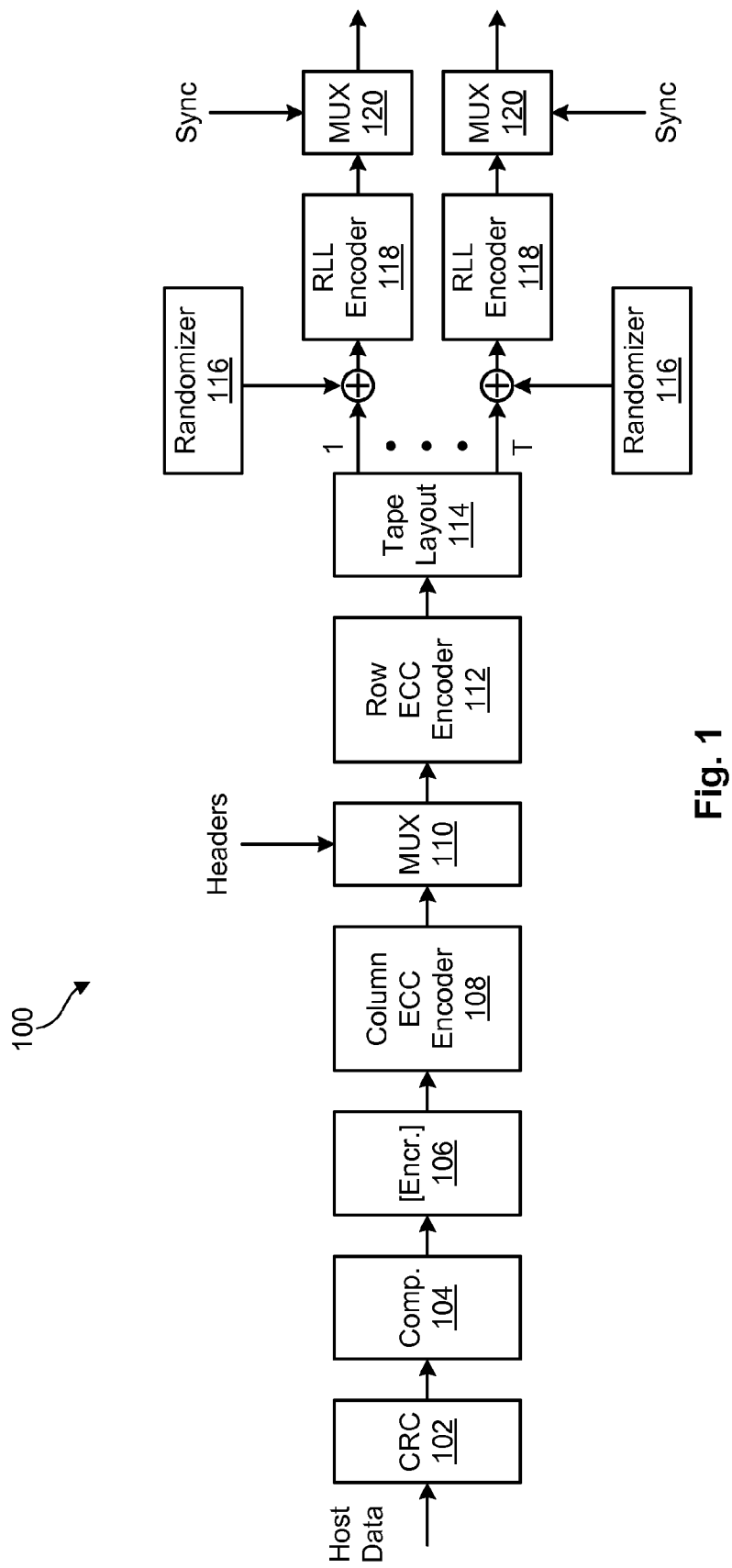
FIG. 1 is a high-level block diagram showing one example of a data flow for a tape drive.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

As will be appreciated by one skilled in the art, the present invention may be embodied as an apparatus, system, method, or computer program product. Furthermore, the present invention may take the form of a hardware embodiment, a software embodiment (including firmware, resident software, microcode, etc.) configured to operate hardware, or an embodiment combining both software and hardware elements. Each of these embodiments may be represented by one or more modules or blocks. Furthermore, the present invention may take the form of a computer-usable storage medium embodied in any tangible medium of expression having computer-usable program code stored therein.

Any combination of one or more computer-usable or computer-readable storage medium(s) may be utilized to store the computer program product. The computer-usable or computer-readable storage medium may be, for example but not limited to, an electronic, magnetic, optical, electromagnetic, infrared, or semiconductor system, apparatus, or device. More specific examples (a non-exhaustive list) of the computer-readable storage medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, or a magnetic storage device. In the context of this document, a computer-usable or computer-readable storage medium may be any medium that can contain, store, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like, and conventional procedural programming languages, such as the "C" programming language or similar programming languages. Computer program code for implementing the invention may also be written in a low-level programming language such as assembly language.

The present invention may be described below with reference to flowchart illustrations and/or block diagrams of methods, apparatus, systems, and computer program products according to embodiments of the invention. It will be understood that each block of the flowchart illustrations and/or block diagrams, and combinations of blocks in the flowchart illustrations and/or block diagrams, may be implemented by computer program instructions or code. The computer program instructions may be provided to a processor of a general-purpose computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be stored in a computer-readable storage medium that can direct a computer or other programmable data processing apparatus to function in a particular manner, such that the instructions stored in the computer-readable storage medium produce an article of manufacture including instruction means which implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Referring to FIG. 1, a high-level block diagram showing one embodiment of a data flow 100 for a tape drive is illustrated. This data flow 100 is presented only by way of example and is not intended to be limiting. Indeed, other data flows 100 may also benefit from the tape layout design disclosed herein and thus are intended to be encompassed within the scope of the invention. The data flow 100 is presented simply to show one example of a process for recording data to magnetic tape.

As shown in FIG. 1, a CRC module 102 receives a sequence of bytes contained within variable-length blocks of data (also known as "records") from a host device. These blocks of data may be any size up to a maximum size supported by a tape drive. The CRC module 102 may add CRC information to these blocks. A compression module 104 may then compress the blocks and an encryption module 106 may optionally encrypt the blocks. The blocks of data may then be broken into data sets of fixed size, which may in turn be broken into sub data sets (SDS) of fixed size. Each SDS may be organized into a two-dimensional array of data. Each SDS data array may then be passed to a column ECC encoder 108. The column ECC encoder 108 may generate ECC parity for each column in the data array and append the column ECC parity to the array.

Once the column ECC parity is generated and appended to the array, a multiplexer 110 may append headers to the rows in the array. The extended array may then be passed to a row ECC encoder 112 which generates row ECC parity for each row in the array. A tape layout module 114 may then distribute the data array, the ECC parity, and the headers across different tracks and in different orders for recording on the magnetic tape. The data sequences may then be processed by randomizers 116 which perform additional signal processing on the data. Run length encoders 118 may then transform the spectra of the information so that it is better suited for magnetic recording. Multiplexers 120 may then multiplex synchronization information, such as variable frequency oscillators (VFOs), sync characters, or the like, into the information to enable it to be synchronized when read. The resulting data may then be sent to write drivers (not shown) which may cause current to flow through recording head elements to generate magnetic flux and thereby write the data to the magnetic recording medium. In general, each of the blocks or modules to the right of the row ECC encoder 112 perform different transformations on the data to make it more suitable for magnetic recording.

Figure 2:
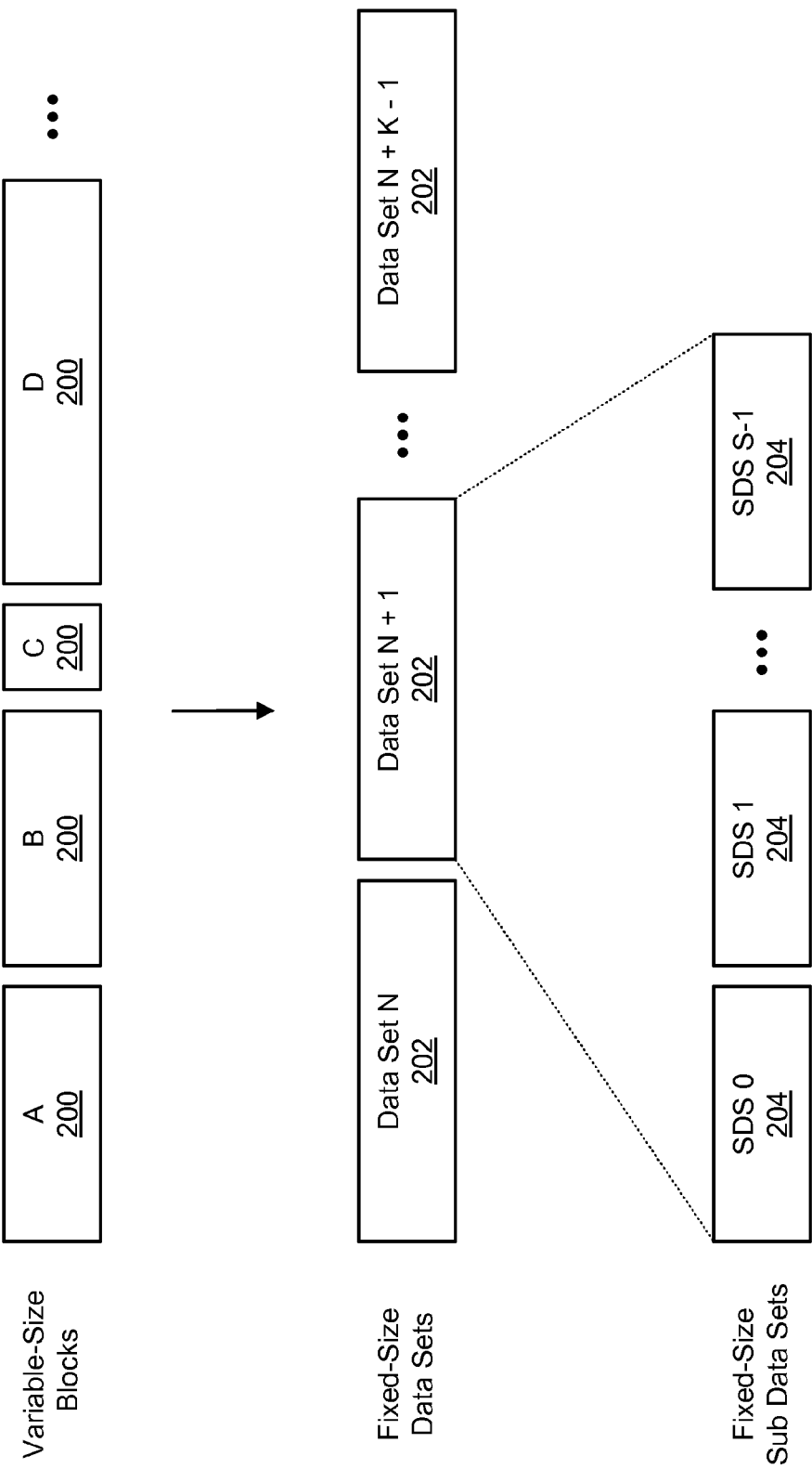
FIG. 2 is a high-level block diagram showing how variable-sized blocks of data received from a host are broken into fixed-sized data sets, and then into smaller fixed-size sub data sets (SDSs)

Referring to FIG. 2, as explained above, a tape drive allocates incoming variable-length blocks 200 of data into data sets 202 of fixed size prior to recording the data on tape. The number of bytes in a data set 202 is typically drive technology dependent and is not visible to the host. The incoming host data begins filling the first data set 202 at the first byte of the data set and continues to the last byte of the data set, then into subsequent data sets, as needed. In certain cases, tape drives may combine multiple small host records 200 into a single data set 202, or may generate multiple data sets 202 from large host records 200. As explained above, each data set 202 comprises some number S of smaller fixed-size data entities referred to as sub data sets (SDSs) 204.

Figure 3:
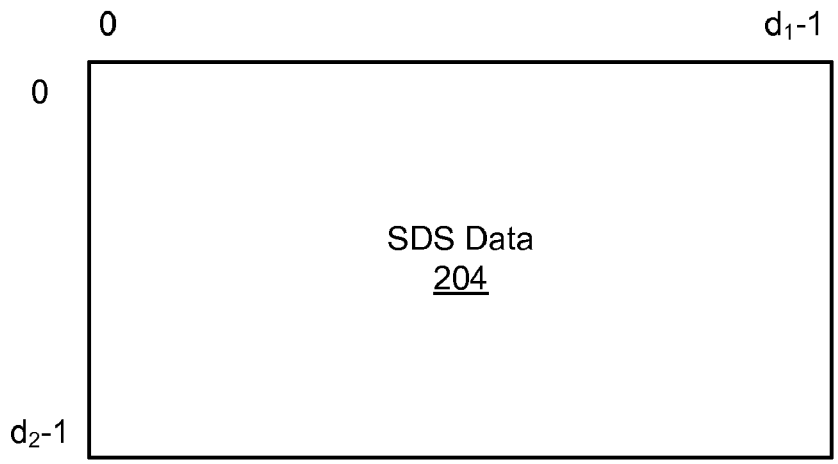
FIG. 3 is a high-level block diagram showing data of an SDS organized into a two-dimensional array.

Referring to FIG. 3, a high-level block diagram of an SDS 204 is illustrated. As shown, the SDS 204 is organized into a matrix of $d_2$ rows and $d_1$ columns. The data from a data set 202 fills the SDS 204 row by row, beginning at row 0, byte 0, and continuing through row $d_2-1$, byte $d_1-1$.

Figure 4:
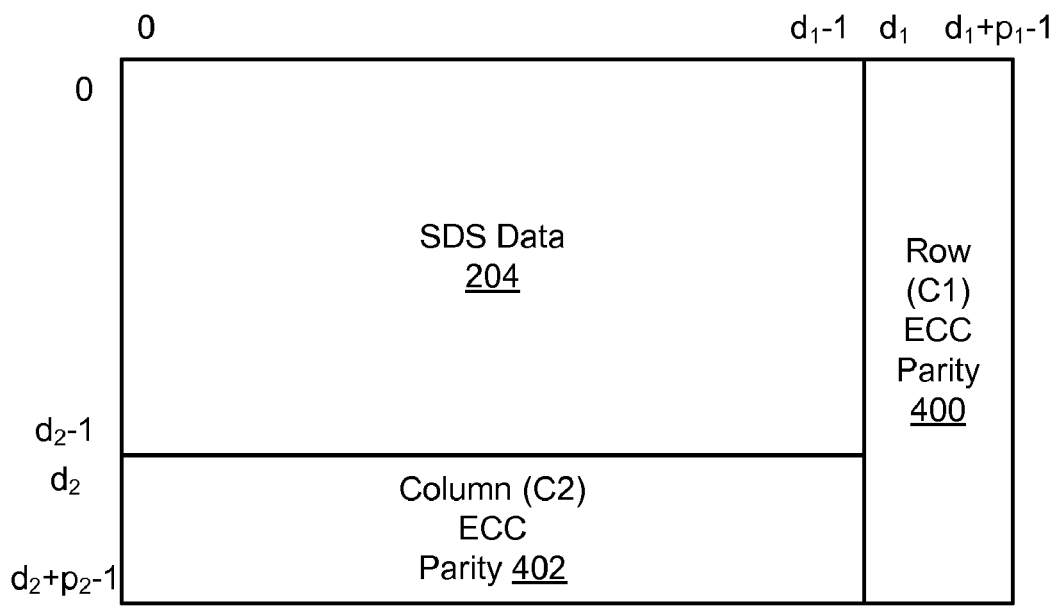
FIG. 4 is a high-level block diagram showing ECC parity appended to the SDS array of FIG. 3, wherein each row of the extended ECC-protected data array is a codeword interleave (CWI)

As shown in FIG. 4, $p_2$ column ECC parity bytes 402 (also known as "C2" parity) are added to each column in the SDS array 204, and $p_1$ row ECC parity bytes 400 (also known as "C1" parity) are added to each row in the SDS array 204. The row ECC parity 400 protects each row of the SDS array 204 while the column ECC parity 402 protects each column in the SDS array 204. Although not necessary in all embodiments, in selected embodiments, the row ECC parity 400 and/or column ECC parity 402 also protects the headers (not shown) for each row in the SDS array 404. Each SDS row, including the rows of column ECC parity data 402, may be considered a C1 codeword.

In selected embodiments, each row contains multiple C1 codewords interleaved in some manner. Thus, for the purposes of this description, each row of the ECC-protected SDS array 404 will be referred to hereinafter as a codeword interleave (CWI), although the CWI may include a single codeword in certain embodiments. Each column of the ECC-protected SDS array 404 may be referred to as a C2 codeword. Each SDS 204 is an independent ECC-protected entity, meaning that the C1 ECC parity 400 and C2 ECC parity 402 for an SDS 204 protects that SDS 204 only. A data set comprises S SDSs, each of which contains $N=d_2+p_2$ CWIs. Thus, the number of CWIs in a data set 202 is $Q=N \times S$.

Figure 5:
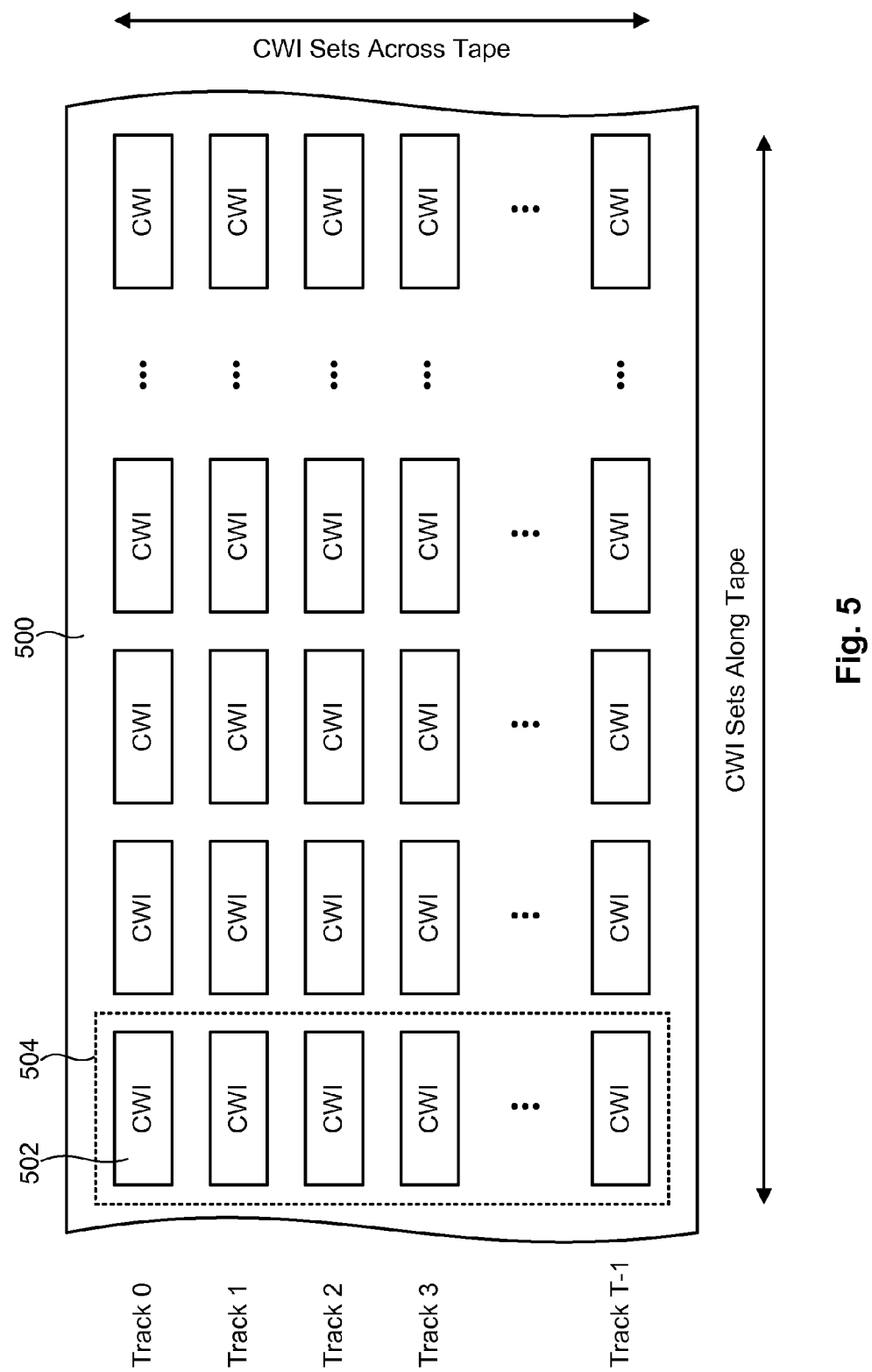
FIG. 5 is a high-level block diagram showing one example of CWIs laid out on magnetic tape.

Referring to FIG. 5, a high-level block diagram showing one example of CWIs 502 laid out on magnetic tape is illustrated. In general, most tape drives read and/or write multiple longitudinal tracks (e.g., 8, 16, or 32 tracks) on magnetic tape 500 simultaneously. In doing so, the CWIs 502 of a data set 202 are written onto the tracks of the tape 500. For a recording format with T simultaneously recorded tracks, T CWIs are written simultaneously, one CWI per track. The group of simultaneously written CWIs is referred to herein as a CWI set 504. As the tape head moves along the magnetic tape 500, CWI sets 504 are read from or written to the tape 500.

Figure 6:
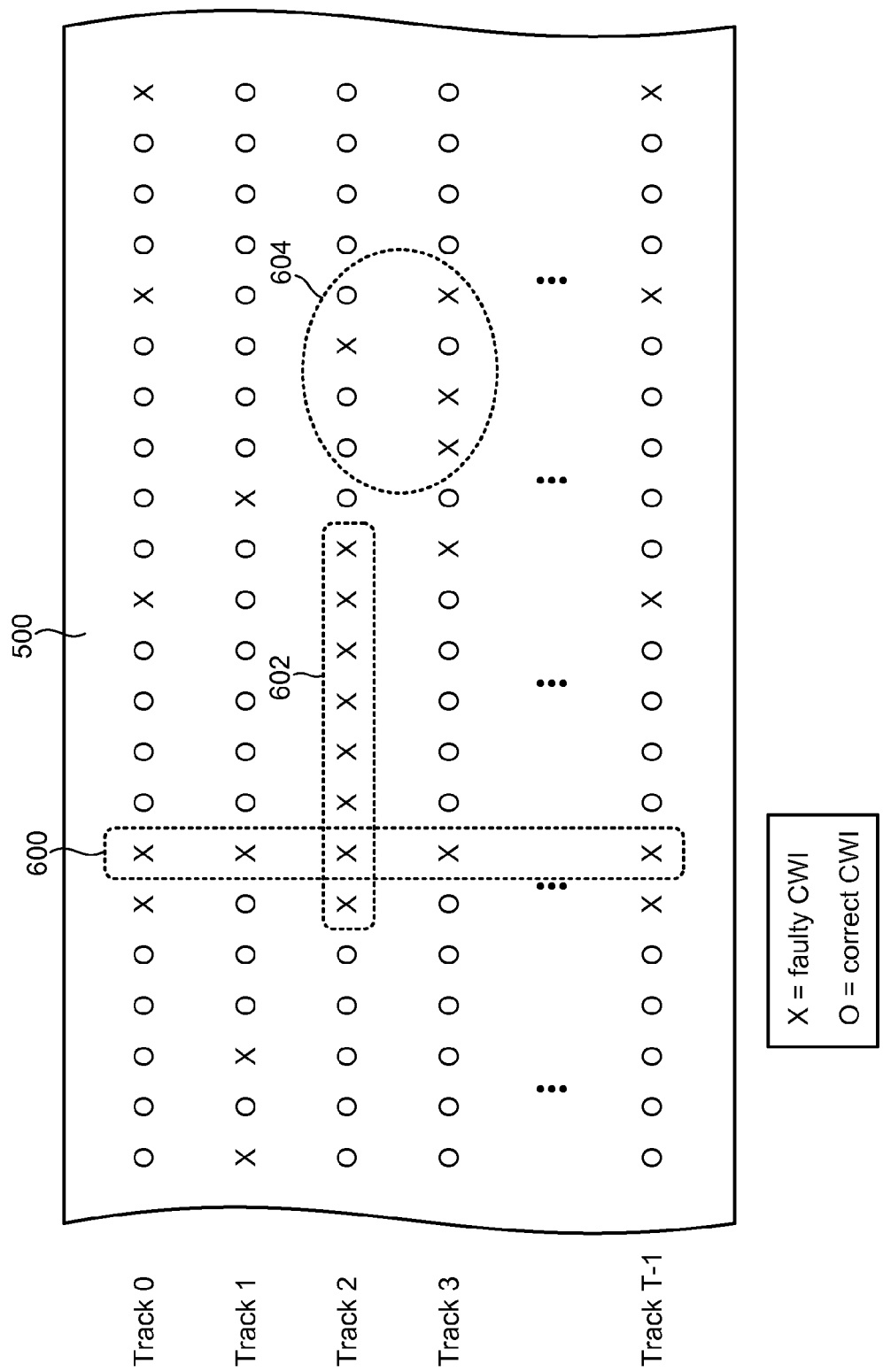
FIG. 6 is a high-level block diagram showing examples of error patterns occurring on magnetic tape.

Referring to FIG. 6, a high-level block diagram showing various patterns in which errors may occur on magnetic tape 500 is illustrated. As is known to those of skill in the art, data recorded on magnetic tape 500 is subject to various types of errors. Errors that occur transverse to the tape 500 (i.e., "across-track errors" 600) may affect multiple tracks in a CWI set 504. These errors may be the result of, for example, head tracking problems, scratches across the tape, edge damage to the tape, manufacturing defects in the tape, debris on the tape, or the like. Errors that occur parallel to the tape 500 (i.e., "along-track errors" 602) may affect multiple CWIs 502 in one or more tracks along the length of the tape 500. These errors may be the result of, for example, defective or clogged write or read heads, scratches along the length of the tape, manufacturing defects in the tape, debris on the tape, or the like. Other errors 604 may occur randomly transverse to and along the tape 500. Such errors 604 may be caused by media defects for example, which are typical in magnetic recording media.

The C1 ECC parity 400 associated with a CWI 502 can correct errors in the recorded CWI 502 up to the correction power of the C1 parity 400. If errors exceed this correction power, then the CWI 502 cannot be corrected by the C1 parity 400 and must be corrected by applying the power of the C2 parity 402 to which the CWI 502 belongs. The C2 parity 402 can correct up to some number of defective CWIs 502 in the SDS 204 depending on the power of the C2 parity 402. If the number of defective CWIs 502 in the SDS 204 exceeds the corrective power of the C2 parity 402, then one or more CWIs 502 in the SDS 204 will be unrecoverable resulting in an unrecoverable data error. As a result, the CWIs 502 should be physically organized on the tape 500 in a manner that minimizes the number of uncorrectable CWIs 502 that occurs in any one SDS 204.

As can be observed from FIG. 6, if CWIs 502 from the same SDS 204 are recorded in a column where multiple across-track errors 600 occur, or in a row where multiple along-track errors 602 occur, the number of errors in the SDS 204 could exceed the correction capability of the C1 parity 400. In such a case, the C2 parity 402 could be used to correct the faulty CWIs 502. If the number of errors was such as to also overwhelm the C2 parity 402, this would result in an unrecoverable data error. As will be explained in more detail hereafter, this situation may be mitigated by physically separating CWIs 502 from the same SDS 204 some distance from one another.

Figure 7:
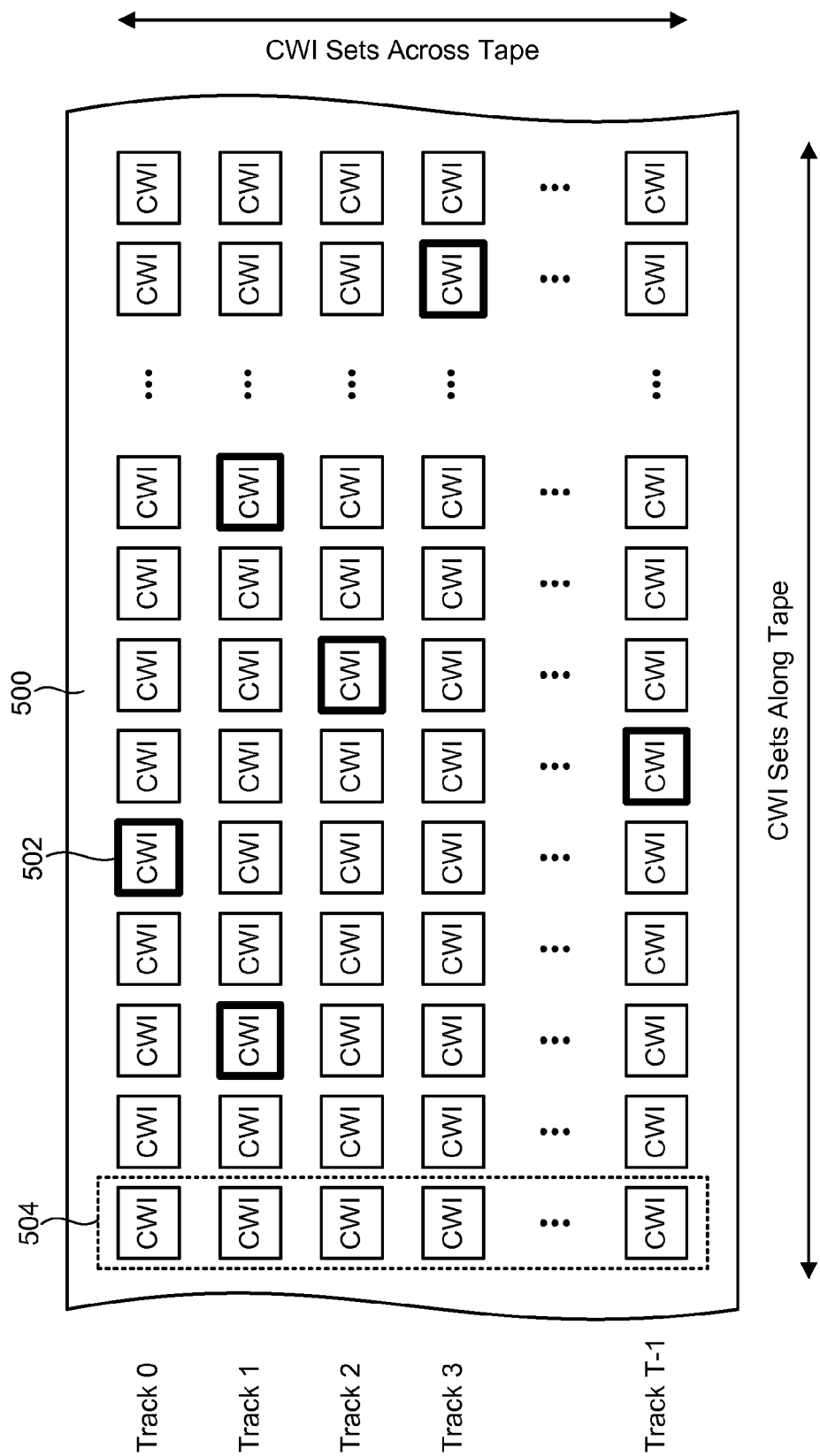
FIG. 7 is a high-level block diagram showing an example of CWIs of an SDS laid out on tape to minimize the number of errors occurring in the SDS.

Referring to FIG. 7, because a data set 202 contains multiple SDSs 204, it is not necessary to record CWIs 502 from the same SDS 204 physically adjacent to one another on the tape 500. Since each SDS 204 is an independent self-contained ECC entity, the error locations on the tape 500 may be decorrelated from the error locations within an SDS 204 by interleaving the CWIs 502 of the plurality of SDSs 204 across tracks and along tracks on the magnetic media. In other words, physically dispersing the CWIs 502 of the plurality of SDSs 204 along and across the tape 500 will reduce the chance that a critical number of errors (enough to overwhelm the C1 and C2 parity 400, 402) will occur in any one SDS 204.

For example, FIG. 7 shows an example of several CWIs 502 (highlighted in bold) from a single SDS 204 distributed along and across the tape 500, surrounded by CWIs from other SDSs in the data set. Only errors that occur in these locations have the ability to corrupt data in the single SDS. The number of errors that occur in these locations needs to be sufficient to exceed the corrective power of the C2 ECC parity 402 before the SDS is rendered uncorrectable. It may be observed from FIG. 7 that errors occurring simultaneously across all tracks in a CWI set 504 would not corrupt more than one CWI in the single SDS (shown in bold), nor would errors occurring along tracks for some number of CWI sets 504 affect more than several CWIs in the SDS.

The greater the physical distance between CWIs 502 of the same SDS 204, the less likely that a single error event will affect more than one CWI 502 in an SDS 204. In many tape recording formats, a CWI 502 from the same SDS 204 is placed every C=S/T CWI sets 504 longitudinally along the tape 500. Similarly, CWIs 502 from the same SDS 204 are nominally placed on tracks that are R data track rotations (transverse to the tape 500) from the previous CWI 502 for that SDS 204. In this manner, CWIs 502 from the same SDS 204 are physically separated along and across the tape 502. The entire pattern of CWIs 502 from all S SDSs 204 written in this manner repeats every v CWI sets where v is equal to:

$$v = u\frac{S}{T}$$

where u is the smallest positive integer that satisfies:

$$0 = MOD(u \times R, T)$$

Figure 8:
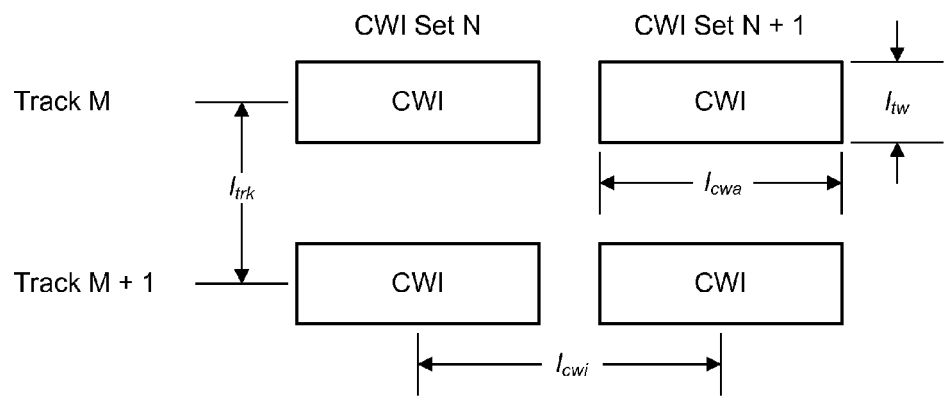
FIG. 8 is a high-level block diagram showing various dimensions that may be used to calculate the corner-to-corner spacing between CWIs.
Figure 9:
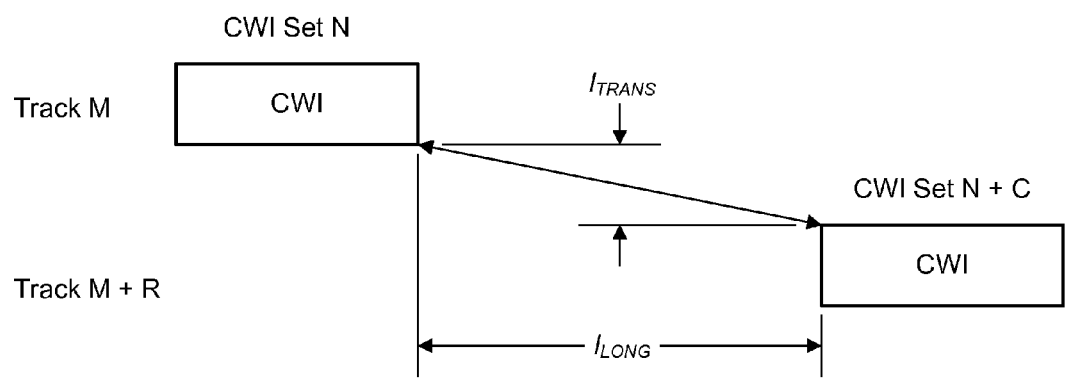
FIG. 9 is a high-level block diagram showing additional dimensions that may be used to calculate corner-to-corner spacing between CWIs.

Referring to FIGS. 8 and 9, the physical distance between two CWIs from the same SDS is readily calculated. If $l_{cwi}$ is the length of a single CWI 502 along a track, and $l_{trk}$ is the centerline distance between adjacent tracks, then the minimum distance between the centers of two CWIs 502 from the same SDS 204 is calculated as follows:

$$\text{Distance} = \sqrt{(l_{cwi} \times C)^2 + (l_{trk} \times R)^2}$$

It will be appreciated that the minimum distance between any portion of two CWIs 502 may be adjusted for the actual track width occupied by the CWI 502 and the actual track length occupied by the CWI 502. For CWIs 502 of actual length $l_{cwa}$ uniformly spaced along a track, and having actual track width $l_{tw}$, the actual distance between corners of two CWIs 502 is:

$$\text{Distance} = \sqrt{(l_{cwi} \times C - l_{cwa})^2 + (l_{trk} \times R - l_{tw})^2}$$

FIG. 9 illustrates the components of the corner-to-corner spacing calculation where $l_{TRANS}$ is the transverse (across track) distance and $l_{LONG}$ is the longitudinal (along the length of the tape) distance, where $l_{TRANS}$ and $l_{LONG}$ are calculated as follows:

$$l_{TRANS} = l_{trk} \times R - l_{tw}$$

$$l_{LONG} = l_{cwi} \times C - l_{cwa}$$

For the sake of simplicity, the distances between CWIs 502 discussed hereinafter are the distances between CWI centers although the corner-to-corner spacing is also readily computed.

The nominal longitudinal and transverse dimensions described above may be intentionally modified to balance or distribute potential systematic sources of weakness. For example, CWIs 502 from an SDS 204 may be periodically swapped between even and odd data tracks because even data tracks and odd data tracks may have systematic differences. Such systematic differences may be the result of recording head design, electronics configuration, signal line routing, or the like. Similarly, CWIs 502 from an SDS 204 may be periodically shifted from even numbered CWI sets 504 to odd numbered CWI sets 504. This is at least partly because CWIs 502 may be organized into higher level data structures prior to being recorded. These higher level data structures may be susceptible to even and odd differences as the result of synchronization and/or other characteristics which may affect the even and odd CWI sets 504 differently.

Figure 10:
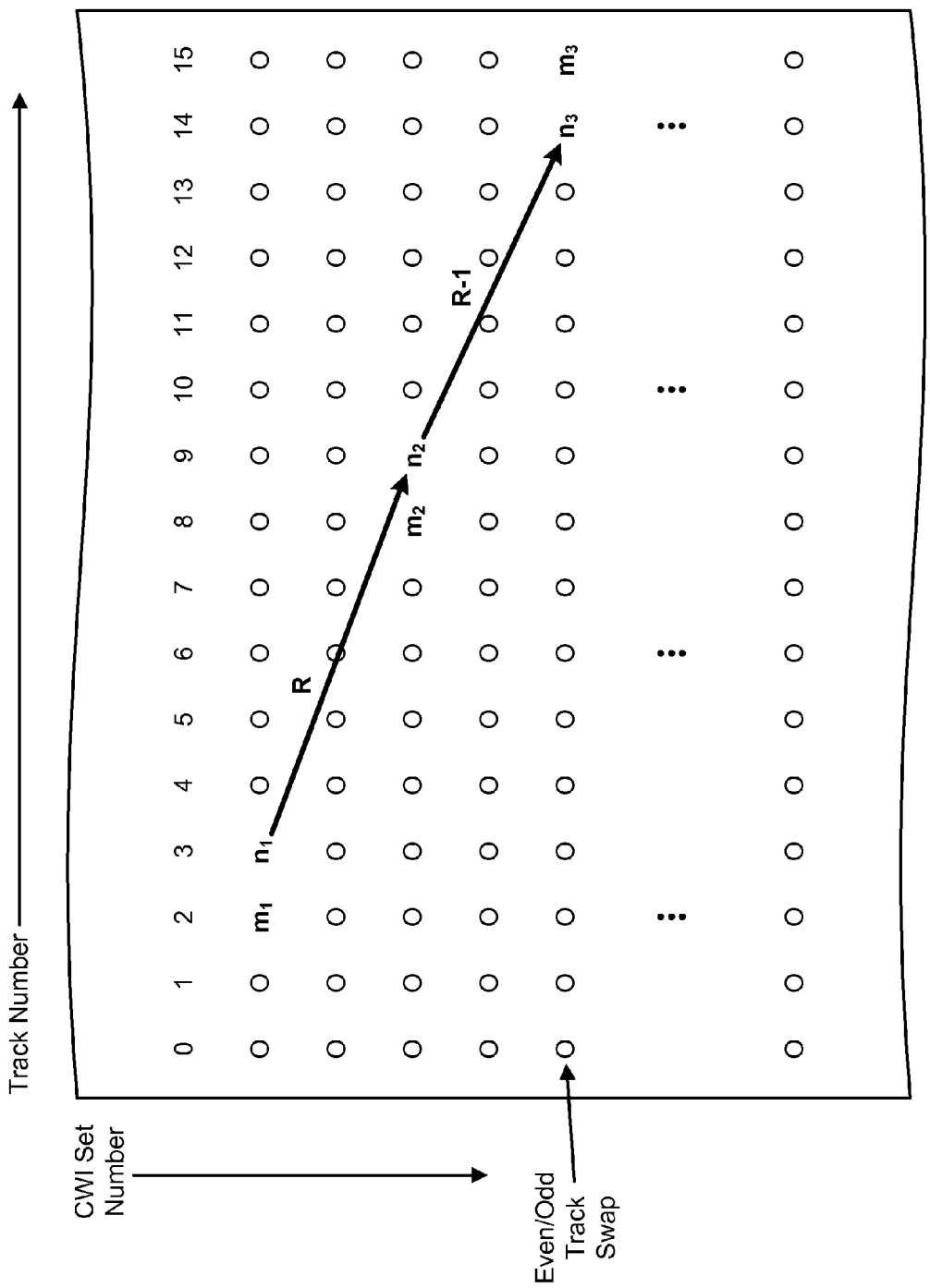
FIG. 10 is a high-level block diagram showing how even and odd track swapping affects the spacing between CWIs.

Referring to FIG. 10, as previously mentioned, swapping even and odd tracks (also called "even-odd track swapping") may be used to balance systematic differences that may occur between even and odd tracks or channels. Even-odd track swapping reduces the minimum effective data track rotation R by one between the last written CWI set 504 prior to the track swap, and the first CWI set 504 written after the track swap. For example, as shown in FIG. 10, prior to the track swap, CWIs from SDS n reside on odd tracks and are rotated by R at each CWI set. However, after a track swap occurs, the next CWI from SDS n is rotated by R−1, causing it to fall on an even track. On the other hand, prior to the track swap, CWIs from SDS m reside on even tracks and are rotated by R at each CWI set. When a track swap occurs, the next CWI from SDS m is rotated by R+1, causing it to fall on an odd track. Even-odd track swapping increases the number v of CWI sets 504 that occur between repetitions of the entire pattern of CWIs from all S SDSs 204.

Figure 11:
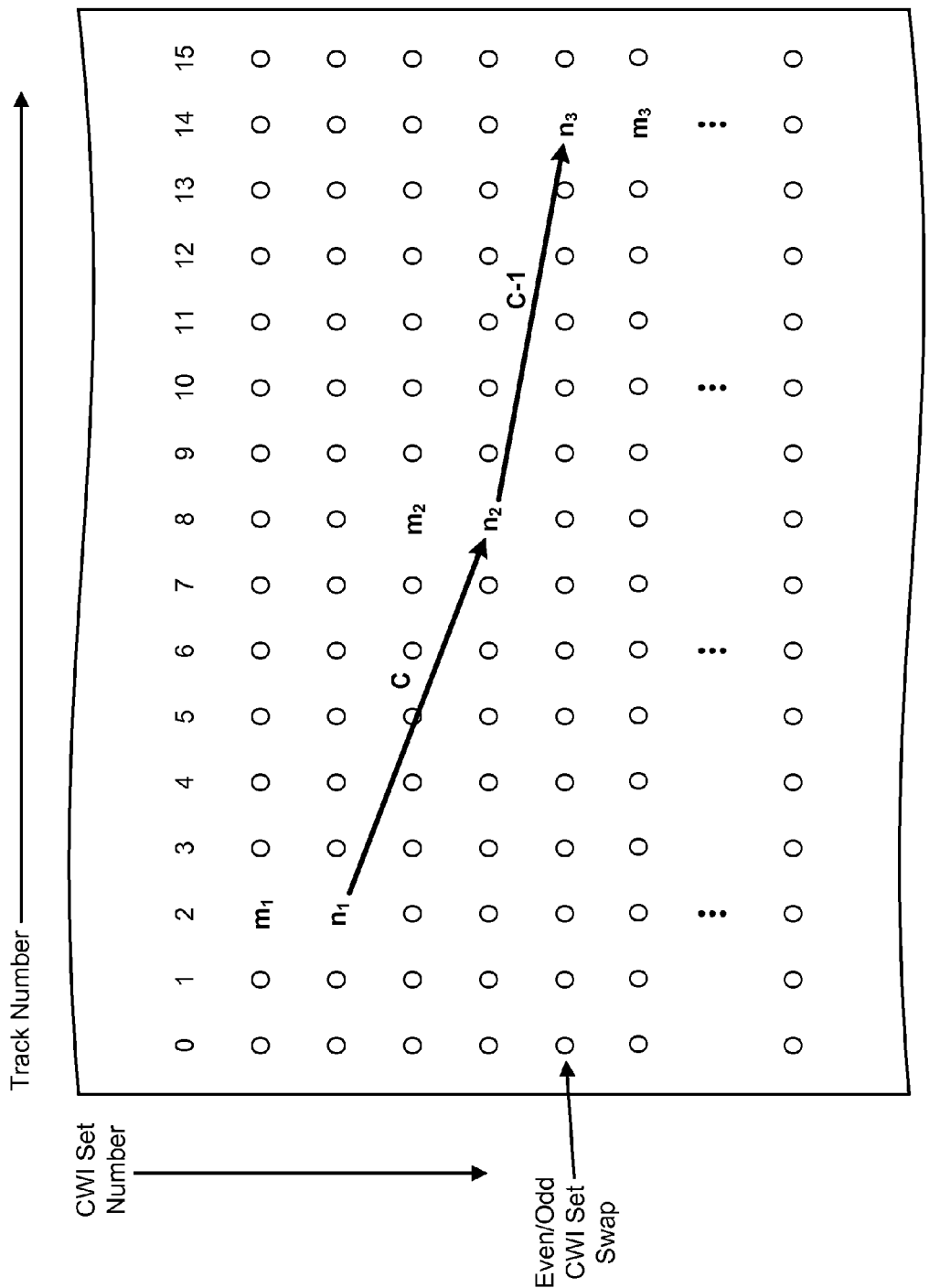
FIG. 11 is a high-level block diagram showing how CWI set swapping affects the spacing between CWIs.

Referring to FIG. 11, as previously mentioned, even and odd CWI sets 504 may also be swapped to balance systematic differences that may occur between even and odd CWI sets 504 along the tape 500. A CWI 502 from the same SDS 204 is nominally placed every C=S/T CWI sets 504 longitudinally along the tape 500. However, CWI set swapping may reduce the minimum effective C by one between the last written CWI set 504 prior to the CWI set swap, and the CWI set 504 written after the CWI set swap. For example, as shown in FIG. 11, prior to the CWI set swap, CWIs 502 from SDS n are contained in even CWI sets 504 with a longitudinal separation C. However, after the CWI set swap occurs, the next CWI 502 from SDS n falls in an odd CWI set 504 with a longitudinal separation of C−1. On the other hand, prior to the CWI set swap, CWIs 502 from SDS m are contained in odd CWI sets 504 with a longitudinal separation C. However, after the CWI set swap occurs, the next CWI 502 from SDS m falls in an even CWI set 504 with a longitudinal separation C+1. CWI set swapping increases the number v of CWI sets 504 that occur between repetitions of the entire pattern of CWIs from all S SDSs 204.

As shown in FIGS. 10 and 11, even-odd track swapping and CWI set swapping can reduce the minimum distance that exists between CWIs 502 of the same SDS 204. More specifically, the minimum distance may be reduced to:

$$\text{Distance} = \sqrt{(l_{cwi} \times (C-1))^2 + (l_{trk} \times (R-1))^2}$$

Thus, in order to maintain a desired spacing between CWIs 502 of the same SDS 204, it would be advantageous to minimize the number of even-odd track swaps and/or the number of CWI set swaps within a data set 202, while still balancing the systematic differences that the CWI set swaps and/or even-odd track swaps were originally intended to address.

Conventional tape recording formats distribute CWIs 502 from an SDS 204 in a practical, but suboptimal manner. For example, the LTO 5 recording format has T=16 data tracks, S=32 SDSs, N=96 CWIs per SDS, and R=6 data track rotations. Even and odd track swaps occur every 16 CWI sets. Even and odd CWI set swaps occur every 32 CWI sets. Using the above-stated values, we can calculate that there are Q=N× S=3072 CWIs per data set in the LTO 5 format. The nominal longitudinal separation between CWIs from the same SDS is C=S/T=2 CWI sets. The total number of CWI sets is Q/T=192. The nominal transverse separation is R=6 tracks. The nominal CWI pattern repeats every v=16 CWI sets. Even and odd track swaps occur at the value v at which the pattern of CWIs repeats. Even and odd CWI set swaps occur at the value 2×v. Hence, the number of track swaps is q=11 and the number of CWI set swaps is m=5 as calculated from the following equations:

$$\text{Track\_Swaps} = q = \frac{N \times S}{T \times v} - 1$$

$$\text{CWI\_Set\_Swaps} = m = \frac{N \times S}{T \times 2 \times v} - 1$$

The nominal CWI separation within a single SDS is:

$$\text{Distance} = \sqrt{(l_{cwi} \times 2)^2 + (l_{trk} \times 6)^2}$$

Six of the track swaps occur without CWI set swaps, reducing the CWI separation to:

$$\text{Distance} = \sqrt{(l_{cwi} \times 2)^2 + (l_{trk} \times 5)^2}$$

Five of the CWI set swaps occur simultaneously with track swaps, reducing the CWI separation to:

$$\text{Distance} = \sqrt{(l_{cwi} \times 1)^2 + (l_{trk} \times 5)^2}$$

Referring to FIG. 12, not all tape recording formats employ even-odd track swapping, CWI set swapping, or large track rotations. The table illustrated in FIG. 12 shows a progression of various recording formats, with format "A" being the least recent and format "C" being the most recent. As shown, format A does not utilize track or CWI set swapping and only utilizes minimum track rotation. This format achieves none of the benefits provided by track and/or CWI set swapping. Format B, on the other hand, implements a combination of track swapping, CWI set swapping, and track rotation. Format C, the most recent of the formats, utilizes the largest number of both track swaps and CWI set swaps. Because of format C's heavy use of track swaps and CWI set swaps, the spacing between CWIs of the same SDS is undesirably reduced.

Referring to FIG. 13, because track swaps and/or CWI set swaps undesirably affect the spacing between CWIs 502 of the same SDSs 204, it would be an advance in the art to provide an improved tape recording format that substantially maximizes the distances between CWIs 502 of the same SDS 204, while minimizing the penalty associated with even-odd track swaps and CWI set swaps. One example of such a tape recording format is illustrated in the table of FIG. 13. As shown in FIG. 3, the number of tracks T is equal to $2^k$ (in this example, $2^5$, or 32) and the number S of SDSs 204 in the data set 202 is 2×T (in this example 64). In this example, each SDS 204 contains 96 rows (or CWIs 502). This will produce a data set that contains 6144 CWIs and 192 CWI sets. As shown, the exemplary tape recording format has no odd-even track swaps and only a single CWI set swap. The track rotation is set to $R=2^{k-1}-1$ which results in a value of 15 in this example. The values shown in FIG. 13 are provided only by way of example and are not intended to be limiting.

For a tape recording format that has a $T=2^k$ tracks, setting the transverse track rotation to $R=2^{k-1}-1$ provides at least two benefits. First, it provides a large distance R between CWIs 502 from the same SDS 204 transverse to the tape 500. Second, because it is an odd number, the track rotation distributes CWIs 502 across all tracks, eliminating the need to perform even-odd track swapping in a separate step. This, in turn, eliminates the track swap penalty.

As was previously explained herein, the longitudinal CWI separation C is a function of the number of tracks T and the number of SDSs S. A minimum number of SDSs 204 that permits longitudinal separation is $S=2\times T=2^{k+1}$. A greater number of SDSs 204 permits greater longitudinal separation C. Multiple CWI set swaps provide no additional benefit. Thus, as shown in FIG. 13, CWI set swapping is set to m=1 to swap even and odd CWI sets 504 only once per data set 202. This, in turn, mostly eliminates the CWI set swap penalty. If the number of SDSs is $S=2^{k+1}$, then the nominal CWI separation within one SDS 204 is calculated as follows:

$$\text{Distance} = \sqrt{\left(l_{cwi} \times \frac{S}{T}\right)^2 + (l_{trk} \times R)^2}$$

The minimum distance occurs only once between two CWI sets 504 in the data set 202 and can be calculated as follows:

$$\text{Distance} = \sqrt{\left(l_{cwi} \times \left(\frac{S}{T} - 1\right)\right)^2 + (l_{trk} \times R)^2}$$

Thus, as described above, a tape recording format such as that illustrated in FIG. 13 substantially maximizes the distances between CWIs 502 of the same SDS 204, while minimizing the penalty associated with even-odd track swaps and CWI set swaps.

If the number S of SDSs 204 is large with respect to the number of tracks T, for example $S=2^{k+2}$, then the nominal CWI separation C within one SDS 204 is greater, in this example 4. CWI set swapping for this larger case becomes a rotation. For example, if a 4-way SDS rotation 0, 1, 2, 3, 0, 1, 2, 3, ..., is performed along track, then at the point the CWI set rotation occurs the pattern would become 0, 1, 2, 3, 1, 2, 3, 0, 1, 2, 3, 0, ..., again incurring the penalty of reducing C by one for each SDS 204. In this example, the penalty reduces C from 4 to 3 one time in each SDS 204. Therefore, one can observe that the improved tape recording format achieves the optimal longitudinal and transverse separation of CWIs 502 from the same SDS 204 for any number of tracks and SDSs 204.

The flowcharts and block diagrams in the Figures illustrate the architecture, functionality, and operation of possible implementations of systems, methods, and computer-usable storage media according to various embodiments of the present invention. In this regard, each block in the flowcharts or block diagrams may represent a module, segment, or portion of code, which comprises one or more executable instructions for implementing the specified logical function (s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The invention claimed is:
1. A method for physically laying out data on tape, the method comprising:
receiving a data set, the data set comprising S sub data sets (SDSs) of fixed size, each SDS comprising N codeword interleaves (CWIs);

distributing the CWIs for the S SDSs across T tracks on a physical tape medium such that the distances between CWIs of the same SDS are substantially maximized on the physical tape medium, wherein distributing the CWIs comprises periodically rotating the tracks in the data set by a track rotation value R, wherein the number of tracks T is equal to $2^k$, and the track rotation value R is equal to $2^{k-1}-1$, where k is a positive integer.

2. The method of claim 1, wherein:
the CWIs are organized into CWI sets, the CWI sets comprising CWIs written simultaneously across the T tracks transverse to the physical tape medium; and
the CWI sets comprise even CWI sets and odd CWI sets.

3. The method of claim 2, further comprising swapping the position of the even CWI sets and odd CWI sets a single time within the data set.

4. The method of claim 1, wherein the T tracks are organized into even tracks and odd tracks.

5. The method of claim 4, further comprising not separately swapping the even and odd tracks in the data set.

6. An apparatus for physically laying out data on tape, the apparatus comprising:
a tape layout module to receive a data set, the data set comprising S sub data sets (SDSs) of fixed size, each SDS comprising N codeword interleaves (CWIs);
the tape layout module further configured to distribute the CWIs for the S SDSs across T tracks on a physical tape medium such that the distances between CWIs of the same SDS are substantially maximized on the physical tape medium; and
the tape layout module further configured to periodically rotate the tracks in the data set by a track rotation value R, wherein the number of tracks T is equal to $2^k$, and the track rotation value R is equal to $2^{k-1}-1$, where k is a positive integer.

7. The apparatus of claim 6, wherein:
the CWIs are organized into CWI sets, the CWI sets comprising CWIs written simultaneously across the T tracks transverse to the physical tape medium; and
the CWI sets comprise even CWI sets and odd CWI sets.

8. The apparatus of claim 7, wherein the tape layout module is further configured to swap the position of the even CWI sets and odd CWI sets a single time within the data set.

9. The apparatus of claim 6, wherein the T tracks are organized into even tracks and odd tracks.

10. The apparatus of claim 9, wherein the tape layout module is further configured to not separately swap the even and odd tracks in the data set.

11. A method for physically laying out data on tape, the method comprising:
receiving a data set, the data set comprising S sub data sets (SDSs) of fixed size, each SDS comprising N codeword interleaves (CWIs);
distributing the CWIs for the S SDSs across T tracks on a physical tape medium such that the distances between CWIs of the same SDS are substantially maximized on the physical tape medium;
organizing the CWIs into CWI sets, the CWI sets comprising CWIs written simultaneously and transversely across the T tracks, the CWI sets comprising even CWI sets and odd CWI sets; and
swapping the position of the even CWI sets and the odd CWI sets a single time within the data set.

12. The method of claim 11, further comprising periodically rotating the tracks in the data set by a track rotation value R.

13. The method of claim 12, wherein the number of tracks T is equal to $2^k$, and the track rotation value R is equal to $2^{k-1}-1$, where k is a positive integer.

14. The method of claim 11, wherein the T tracks are organized into even tracks and odd tracks.

15. The method of claim 14, further comprising not separately swapping the even and odd tracks in the data set.

16. An apparatus for physically laying out data on tape, the apparatus comprising:
a tape layout module to receive a data set, the data set comprising S sub data sets (SDSs) of fixed size, each SDS comprising N codeword interleaves (CWIs);
the tape layout module further configured to distribute the CWIs for the S SDSs across T tracks on a physical tape medium such that the distances between CWIs of the same SDS are substantially maximized on the physical tape medium;
the tape layout module further configured to organize the CWIs into CWI sets, the CWI sets comprising CWIs written simultaneously and transversely across the T tracks, the CWI sets comprising even CWI sets and odd CWI sets; and
the tape layout module further configured to swap the position of the even CWI sets and the odd CWI sets a single time within the data set.

17. The apparatus of claim 16, wherein the tape layout module is further configured to periodically rotate the tracks in the data set by a track rotation value R.

18. The apparatus of claim 17, wherein the number of tracks T is equal to $2^k$, and the track rotation value R is equal to $2^{k-1}-1$, where k is a positive integer.

19. The apparatus of claim 16, wherein the T tracks are organized into even tracks and odd tracks.

20. The apparatus of claim 19, wherein the tape layout module is further configured to not separately swap the even and odd tracks in the data set.

* * * * *